(12) United States Patent
Takano et al.

(10) Patent No.: US 11,548,993 B2
(45) Date of Patent: Jan. 10, 2023

(54) METHOD FOR MODIFYING FLUORING RESIN FILM

(75) Inventors: Jun Takano, Izumiotsu (JP); Terunori Yamaguchi, Izumiotsu (JP)

(73) Assignee: STELLA CHEMIFA CORPORATION, Osaka (JP)

( * ) Notice: Subject to any disclaimer, the term of this patent is extended or adjusted under 35 U.S.C. 154(b) by 437 days.

(21) Appl. No.: 12/992,961

(22) PCT Filed: Jun. 18, 2009

(86) PCT No.: PCT/JP2009/061111
§ 371 (c)(1),
(2), (4) Date: Nov. 16, 2010

(87) PCT Pub. No.: WO2009/154252
PCT Pub. Date: Dec. 23, 2009

(65) Prior Publication Data
US 2011/0086230 A1    Apr. 14, 2011

(30) Foreign Application Priority Data

Jun. 19, 2008 (JP) .............................. JP2008-160889

(51) Int. Cl.
| | | |
|---|---|---|
| *C08J 7/12* | (2006.01) | |
| *H01L 31/049* | (2014.01) | |
| *H01M 14/00* | (2006.01) | |

(52) U.S. Cl.
CPC .............. *C08J 7/12* (2013.01); *H01L 31/049* (2014.12); *H01M 14/005* (2013.01); *C08J 2327/12* (2013.01); *Y02E 10/50* (2013.01); *Y10T 428/3154* (2015.04)

(58) Field of Classification Search
None
See application file for complete search history.

(56) References Cited

U.S. PATENT DOCUMENTS

| | | |
|---|---|---|
| 3,162,623 A | 12/1964 | Cairns et al. |
| 5,425,832 A | 6/1995 | Kusano et al. |
| 5,593,532 A | 1/1997 | Falk et al. |
| 6,462,142 B1 | 10/2002 | Hobbs et al. |

(Continued)

FOREIGN PATENT DOCUMENTS

| | | |
|---|---|---|
| JP | 3-126734 A | 5/1991 |
| JP | 8-500214 A | 1/1996 |

(Continued)

OTHER PUBLICATIONS

Office Action dated Apr. 18, 2012 in corresponding Chinese Application No. 200980122909.1.

(Continued)

*Primary Examiner* — Joel G Horning
(74) *Attorney, Agent, or Firm* — Knobbe Martens Olson & Bear LLP (57) ABSTRACT

A simple short-time method for modifying a fluorine resin film so that hydrophilicity is not likely to deteriorate over time. The method for modifying a fluorine resin film is characterized in that the surface of the fluorine resin film is provided with hydrophilicity by bringing the fluorine resin film into contact with a process gas, which contains gas containing fluorine atoms and at least one of gas containing oxygen atoms or inert gas.

3 Claims, 2 Drawing Sheets

(56) References Cited

U.S. PATENT DOCUMENTS

| | | | | |
|---|---|---|---|---|
| 2004/0192868 A1* | 9/2004 | Kaspar et al. | ............... | 526/249 |
| 2008/0044715 A1* | 2/2008 | Vyas et al. | ..................... | 429/38 |
| 2009/0101204 A1* | 4/2009 | Levy | .................. | B32B 37/153 |
| | | | | 156/60 |
| 2009/0130537 A1* | 5/2009 | Osada | ............... | H01M 8/0228 |
| | | | | 429/437 |

FOREIGN PATENT DOCUMENTS

| | | | |
|---|---|---|---|
| JP | 9-227705 A | 9/1997 | |
| JP | 2001-19857 A | 1/2001 | |
| JP | 2001-72779 A | 3/2001 | |
| JP | 2001-181422 A | 7/2001 | |
| JP | 2002-194125 A | 7/2002 | |
| JP | 3585833 B2 | 8/2004 | |
| WO | WO-2007021814 A2 * | 2/2007 | ............. C08J 7/126 |

OTHER PUBLICATIONS

Extended European Search Report dated Mar. 1, 2013 in Corresponding Application No. 09766700.0.
Database WPI Week 200058 Thomson Scientific, London, GB; AN 2000-604588.
Office Action dated Oct. 29, 2012 in corresponding Chinese Patent Application No. 200980122909.1.

* cited by examiner

METHOD FOR MODIFYING FLUORING RESIN FILM

This application is the U.S. National Phase under 35. U.S.C. § 371 of International Application PCT/JP2009/061111, filed Jun. 18, 2009, which claims priority to Japanese Patent Application No. 2008-160889, filed Jun. 19, 2008. The International Application was published under PCT Article 21(2) in a language other than English.

TECHNICAL FIELD

The present invention relates to a method for modifying a fluorine resin film in order to give hydrophilicity to a surface of the fluorine resin film.

BACKGROUND ART

As a back sheet material for a solar battery, use is made of a fluorine resin film such as a polyvinyl fluoride (PVF) film, an aluminum foil laminate, a polyethylene terephthalate (PET) film subjected to aluminum vapor deposition or Si vapor deposition, or some other film in order to improve the weather resistance and the gas barrier performance. In this way, solar battery cells, which are weak in humidity, are protected from water vapor.

Of the back sheet materials, the fluorine resin film is excellent from the viewpoint of long-term endurance. Therefore, demands of the film as a back sheet material have been increasing. In general, however, material made of a fluorine resin having a C—F bond has problems that the material is small in surface energy and shows water repellency and oil repellency, so as to be low in adhesiveness.

Examples of a technique for improving the adhesiveness of such fluorine resin films include plasma discharge treatment, corona discharge treatment, and flame treatment. In these surface-modifying techniques, a hydrophilic functional group (such as a —COOH group, —OH group, $SO_3H$ group, or $SO_2F_x$ group) is introduced into any surface of the resin, thereby improving the adhesiveness thereof.

However, according to these treating methods, a large-scale apparatus is required, and costs for the production increase. Moreover, there remains a problem that after the surface modification, the film deteriorates heavily with the passage of time, and the adhesive performance thereof cannot be kept over a long term.

Patent document 1 described below describes a surface-modifying method of selecting, as a synthetic or natural polymeric material, a material which has a specific gravity of 1.6 or less and does not contain an ether bond, carbonate bond, amide bond or urethane bond at all, and then bringing a mixed gas composed of fluorine gas and a single gas containing an oxygen element into contact with the synthetic or natural polymeric material, thereby giving hydrophilicity thereto. This publication includes a disclosure that according to the surface-modifying method, the contact angle of any surface of the synthetic or natural polymeric material to water is made small by 10 degrees or more.

However, this conventional technique cannot be applied to any fluorine resin having a specific gravity of about 1.6 to 2.2 for the following reason: in synthetic polymeric or natural polymeric material having a specific gravity more than 1.6, the crystal structure thereof is grown or developed; therefore, fluorine gas does not diffuse therein easily, so that a surface-modification function is not easily expressed.

PRIOR ART DOCUMENTS

Patent Document
Patent document 1: Japanese Patent No. 3585833

SUMMARY OF THE INVENTION

Problems to be Solved by the Invention

In light of the problems, an object thereof is to provide a method for modifying, simply in a short time, a fluorine resin film so as not to be deteriorated in hydrophilicity with the passage of time. Another object thereof is to provide a back sheet for a solar battery which has a fluorine resin film yielded by the modifying method.

Means for Solving the Problems

In order to solve the problems in the prior art, the inventors have made investigations on a method for modifying a fluorine resin film, and a back sheet for a solar battery. As a result, the inventors have found out that the objects can be attained by adopting structures described below, and have then made the invention.

In order to achieve the above described object, the present invention relates to a method for modifying a fluorine resin film, wherein a process gas which contains a gas containing fluorine atoms and at least one of a gas containing oxygen atoms or inert gas is brought into contact with the fluorine resin film, thereby giving hydrophilicity to a surface of the fluorine resin film.

According to the method, a process gas which contains a gas containing fluorine atoms and at least one of a gas containing oxygen atoms or inert gas is brought into contact with a surface of a fluorine resin film, thereby making it possible to conduct hydrophilicity-imparting treatment simply in a short time while costs for the production are restrained. According to the method, in the fluorine resin film subjected to the hydrophilicity-imparting treatment, deterioration in the hydrophilicity thereof with the passage of time can be also decreased.

It is preferable that the fluorine resin film comprises tetrafluoroethylene/perfluoroalkyl vinyl ether copolymer (PFA), polyvinylidene fluoride (PVDF), polyvinyl fluoride (PVF), polychlorotrifluoroethylene (PCTFE), ethylene/chlorotrifluoroethylene copolymer (ETCFE), or ethylene/tetrafluoroethylene copolymer (ETFE).

It is preferable that the fluorine resin film comprises an additive reactive with the process gas.

When the additive, which is reactive with the process gas, is incorporated into the fluorine resin film, the impartation of hydrophilicity onto the surface of the fluorine resin film is promoted. This manner makes it possible to conduct the hydrophilicity-imparting treatment more effectively.

It is preferable that the content by percentage of the additive ranges from 0.1 to 90% by weight of the whole of the fluorine resin film.

And in order to achieve the above described object, the present invention relates to a back sheet for a solar battery, which has a structure wherein the above described fluorine resin films are bonded to both surfaces of a substrate film, respectively, through an adhesive.

Since hydrophilicity is imparted to the fluorine resin film, the film is excellent in adhesion to an adhesive. It is therefore possible that the fluorine resin film is bonded to each surface of a substrate film and the resultant lamination is used as a back sheet for a solar battery. About the hydrophilicity imparted by the treatment, the performance can be maintained over a long term; thus, the film is also excellent from the viewpoint of process-management, so that the reliability of the product is improved.

Advantageous Effects

The invention has the above-mentioned means, thereby producing advantageous effects as described in the following:

According to the invention, a process gas which contains a gas containing fluorine atoms and at least one of a gas containing oxygen atoms or inert gas is brought into contact with a surface of a fluorine resin film, thereby making it possible to conduct hydrophilicity-imparting treatment simply in a short time while costs for the production are restrained. Thus, the production efficiency is improved. Moreover, the fluorine resin film yielded by the method can be preferably used in, for example, a back sheet for a solar battery.

EMBODIMENTS FOR CARRYING OUT THE INVENTION

The method for modifying a fluorine resin film according to the present embodiment is a method of bringing a process gas which contains a gas containing fluorine atoms and at least one of a gas containing oxygen atoms or inert gas into contact with a fluorine resin film, which is relatively low in critical surface tension and does not get wet easily, thereby making the film hydrophilic.

It is preferred to use a fluorine resin film the critical surface tension of which is 18 mN/m or more, preferably 20 mN/m or more before the hydrophilicity-imparting treatment. If the critical surface tension before the treatment is less than 18 mN/m, there is caused an inconvenience that hydrophilicity cannot be sufficiently given thereto.

It is also preferred that the fluorine resin film is made hydrophilic to set the critical surface tension of a surface or any surface thereof to 25 mN/m or more, preferably 30 mN/m or more, more preferably 35 mN/m or more. If the critical surface tension is less than 25 mN/m, the film is not sufficiently made hydrophilic so that the adhesion thereof to an adhesive is unfavorably declined.

The value of the critical surface tension is calculated out as follows: use is made of a mixed solvent of ethylene glycol monoethyl ether and formamide which has an already-known surface tension ($\gamma$) (28 to 58 mN/m) and a mixed solvent of formamide and methylene blue which has an already-known surface tension ($\gamma$) (60 to 70 mN/m) to measure the contact angle ($\theta$) of the fluorine resin film surface to each of the solvents; next, values of cos $\theta$ (Y axis) versus $\gamma$ (X axis) are plotted; and the extrapolative value of $\gamma LV$ giving 1 as a value of the solid/liquid contact angle cos $\theta$ is calculated, whereby the critical surface tension value is obtained. The larger the numerical value of the critical surface tension is, the higher the wettability is; and the smaller the numerical value of the critical surface tension is, the lower the wettability is The fluorine resin film may have a monolayered structure or a laminated structure wherein at least two films are laminated onto each other. The thickness of the fluorine resin film (when the film has a laminated structure, the thickness is the total thickness of the individual layers) is not particularly limited, and ranges preferably from, for example, 10 to 100 μm. The two-dimensional shape of the fluorine resin film is not particularly limited, and may be appropriately set in accordance with request.

The constituting material of the fluorine resin film is not particularly limited as far as the material has, in the molecular structure thereof, at least one of a nitrogen-containing group, a silicon-containing group, an oxygen-containing group, a phosphorus-containing group, a sulfur-containing group, a hydrocarbon group, and a halogen-containing group. Examples of the nitrogen-containing group include amide and amino groups. Examples of the silicon-containing group include trialkylsilyl, silyl ether, and —Si(CH$_3$)$_2$O— groups. Examples of the oxygen-containing group include ester, carbonate, and ether groups. Examples of the phosphorus-containing group include a phosphoryl choline group. Examples of the sulfur-containing group include sulfo, and sulfonyl groups. Examples of the hydrocarbon group include methyl, methylene and phenyl groups. Examples of the halogen-containing group include a —CHX— group, a —CHX$_2$ group, a —CX$_2$— group, and a —CX$_3$ group wherein X(s) is/are at least one selected from the group consisting of F, Cl, Br and I atoms. Specific examples thereof include tetrafluoroethylene/perfluoroalkyl vinyl ether copolymer (PFA), polyvinylidene fluoride (PVDF), polyvinyl fluoride (PVF), polychlorotrifluoroethylene (PCTFE), ethylene/chlorotrifluoroethylene copolymer (ETCFE), and ethylene/tetrafluoroethylene copolymer (ETFE). These may be used alone or in combination of two or more thereof.

When the fluorine resin film has a laminated structure composed of at least two films, the constituting material of the film on the front surface side may be identical with or different from that of the film on the rear surface side. When the constituting materials of the two films are made different from each other, the film of the front surface can be made different in the degree of hydrophilicity from that of the rear surface in accordance with the combination of the materials even when the films are subjected to the hydrophilicity-imparting treatment under the same conditions.

It is preferred to add, into the fluorine resin film, an additive reactive with the process gas. This makes it possible that for the hydrophilicity-imparting treatment with the process gas, the hydrophilicity-impartation can be further promoted.

When the fluorine resin film has a laminated structure composed of at least two films, the composition ratio of the additive in the film on the front surface side may be identical with or different from that of the additive in the film on the rear surface side. When the composition ratios of the additive are made different from each other, the film on the front surface side can be made different in critical surface tension value from the film on the rear surface side even when the films are subjected to the hydrophilicity-imparting treatment under the same conditions. In short, in the film wherein the addition amount of the additive is larger, the film is made higher in hydrophilicity even when the films are treated under the same conditions.

The additive is classified into organic additives and inorganic additives. The organic additives are preferably resin components that are different from the polymeric compounds given as examples of the constituting material of the fluorine resin film and each have, in the molecular structure thereof, a functional group reactive with the process gas. When such a resin component is contained therein, the fluorine-atom-containing gas reacts with the reactive functional group so that the fluorinating treatment is promoted. In this way, the hydrophilicity is further improved.

Examples of the functional group reactive with the process gas include a nitrogen-containing group, a silicon-containing group, an oxygen-containing group, a phosphorus-containing group, a sulfur-containing group, a hydrocarbon group, and a halogen-containing group. Examples of the nitrogen-containing group include amide and amino groups. Examples of the silicon-containing group include trialkylsilyl, silyl ether, and —$Si(CH_3)_2O$— groups. Examples of the oxygen-containing group include ester, carbonate, and ether groups. Examples of the phosphorus-containing group include a phosphoryl choline group. Examples of the sulfur-containing group include sulfo, and sulfonyl groups. Examples of the hydrocarbon group include methyl, methylene and phenyl groups. Examples of the halogen-containing group include a —CHX— group, a —$CHX_2$ group, a —$CX_2$— group, and —$CX_3$ group wherein X(s) is/are at least one selected from the group consisting of F, Cl, Br and I atoms.

More specifically, the resin components are, for example, polymethyl methacrylate (PMMA), polyethylene terephthalate (PET), polyethylene naphthalate (PEN), polybutylene terephthalate (PBT), polycyclohexanedimethanol terephthalate (PCT), polycarbonate (PC), and polyolefins. These resin components may be used alone or in combination of two or more thereof.

The inorganic additives are not particularly limited, and examples thereof include white pigments such as titanium oxide and calcium carbonate, and black pigments such as carbon black. These inorganic additives may be used alone or in combination of two or more thereof. Any of the organic additives may be used together with any of the inorganic additives.

The addition amount of the additive is not particularly limited, and is preferably from 0.1 to 90% by weight of the whole of the fluorine resin film, more preferably from 0.1 to 80% by weight thereof. If the addition amount is less than 0.1% by weight, for example, the film may not obtain a sufficient hydrophilicity even when the film is subjected to the hydrophilicity-imparting treatment. By contrast, if the addition amount is more than 90% by weight, there is caused an inconvenience that performances of the fluorine resin itself cannot be kept.

The process gas is not particularly limited as far as the gas is a gas which contains a gas containing fluorine atoms and at least one of a gas containing oxygen atoms or inert gas. The fluorine-atom-containing gas is not particularly limited, and examples thereof include hydrogen fluoride (HF), fluorine ($F_2$), trifluorochlorine ($ClF_3$), tetrafluorosulfur ($SF_4$), trifluoroboron ($BF_3$), and trifluoronitrogen ($NF_3$). These gases may be used alone or in combination of two or more thereof.

The method of the invention for modifying a fluorine resin film can be performed in such a range that the fluorine-atom-containing gas concentration is from 0.001 to 99% by volume of the whole of the process gas. However, if the fluorine-atom-containing gas concentration is large, a damage may be given to the fluorine resin film, which is a product to be treated. It is therefore preferred that the gas concentration is low. Specifically, the concentration is, for example, from 0.001 to 50% by volume, more preferably from 0.001 to 10% by volume.

The oxygen-atom-containing gas is not particularly limited, and examples thereof include oxygen gas ($O_2$), sulfur dioxide gas ($SO_2$), and carbonyl fluoride ($COF_2$). These gases may be used alone or in combination of two or more thereof.

The method of the invention for modifying a fluorine resin film can be performed in such a range that the oxygen-atom-containing gas concentration is from 0.001 to 99% by volume of the whole of the process gas. However, the oxygen-atom-containing gas can produce an advantageous effect thereof sufficiently even in a small amount. It is therefore preferred from the viewpoint of treatment costs also that the gas concentration is low. Specifically, the concentration is, for example, from 0.01 to 50% by volume, more preferably from 0.01 to 20% by volume.

An inert gas, such as dry air, nitrogen, argon, helium, neon, krypton or xenon, may be blended with the process gas in order to dilute the process gas.

Figure 1:
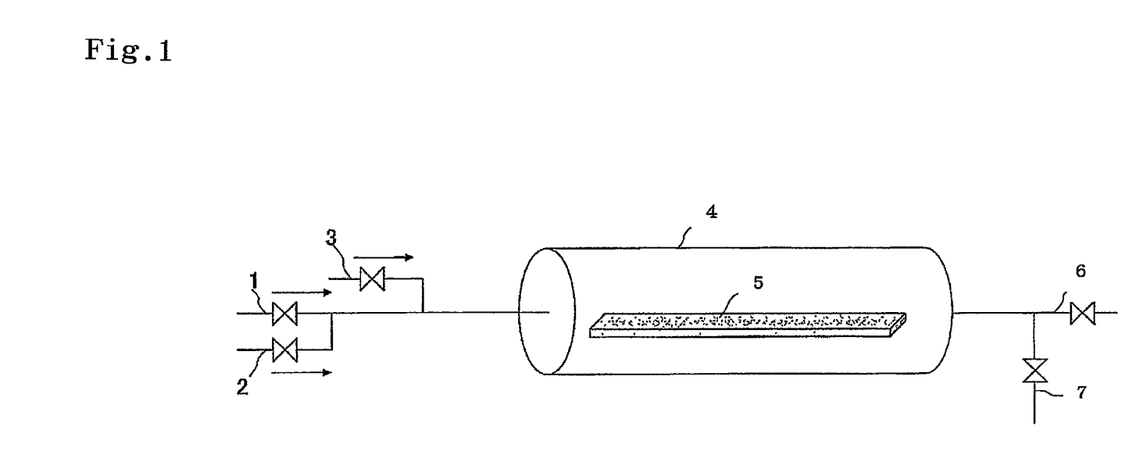
FIG. 1 The figure is a schematic view illustrating an example of a reactor used for hydrophilicity-imparting treatment of a fluorine resin film according to an embodiment of the invention.

The method of the invention for modifying a fluorine resin film can be performed by use of, for example, a reactor illustrated in FIG. 1. Prepared is first a reactor 4 for subjecting any fluorine resin film to hydrophilicity-imparting treatment, and a fluorine resin film 5 is put in the reactor 4. The reactor 4 is not particularly limited, and may be, for example, a reactor made of stainless steel, aluminum or nickel.

Next, when the pressure in the reactor 4 is reduced, a valve of a vacuum line 7 is opened to degas the reactor into a vacuum. After the pressure reaches a predetermined pressure (for example, 10 Pa), the valve of the vacuum line 7 is closed.

As needed, next, the following valves are appropriately opened: valves of a first supply line 1 through which a fluorine-atom-containing gas is supplied; a second supply line 2 through which an oxygen-atom-containing gas is supplied; and a third supply line 3 through which an inert gas is supplied. A process gas which is thus adjusted into predetermined concentrations is introduced into the reactor 4.

In this way, the process gas is brought into contact with the fluorine resin film 5 to subject the film 5 to a hydrophilicity-imparting treatment. The critical surface tension of the fluorine resin film 5 after the hydrophilicity-imparting treatment can be controlled by setting the concentration of the process gas, the treating period, the treating temperature, and the gas flow rates as needed. However, when the surface area of the fluorine resin film 5 is large, it is necessary to use treating conditions and a reactor corresponding to the size thereof. The reaction may be conducted while the process gas is continuously supplied under normal pressure, increased pressure or reduced pressure. Alternatively, the reaction may be conducted in a state sealed at normal pressure, increased pressure or reduced pressure.

The concentration of the fluorine-atom-containing gas in the process gas can be adjusted through the gas amount supplied from each of the first supply line 1 to the third supply line 3.

The treating period for the hydrophilicity-imparting treatment is not particularly limited. The reaction between the fluorine resin and the process gas is explosively generated at the initial stage of the reaction; thus, by the treatment for a relatively short period, the advantageous effects of the hydrophilicity-impartation are obtained. Specifically, the period ranges, for example, from 1 second to 600 minutes, preferably from 1 second to 100 minutes, more preferably from 1 second to 30 minutes. If the treating period is less than 1 second, a sufficient hydrophilicity may not be given to the fluorine resin film 5.

The treating temperature for the hydrophilicity-imparting treatment is not particularly limited. Considering the heat resistant temperature of the fluorine resin film 5 (when the additive is added thereto, the heat resistant temperature thereof is considered), the treating temperature is preferably from −50 to 150° C., more preferably from 0 to 100° C. If the treating temperature is lower than −50° C., a sufficient hydrophilicity may not be given to the fluorine resin film 5. By contrast, if the treating temperature is higher than 150° C., the fluorine resin film is thermally deformed so that the yield may be declined.

The gas flow rate of the process gas flowing in the reactor 4 is not particularly limited. When the gas flow rate is large, the reaction may be explosively caused; thus, at the initial stage of the reaction, it is important to set the concentration of the fluorinated gas and the flow rate appropriately. In other words, in accordance with the progress of the reaction, the concentration and the flow rate may be appropriately made large or small. The gas flow rate may be appropriately set in accordance with the size of the reactor 4 and the shape of the fluorine resin film 5.

After the end of the hydrophilicity-imparting treatment, the valve of the third supply line 3 is opened to introduce an inert gas, thereby substituting the inert gas, at a predetermined flow rate, for the process gas in the reactor 4. At this time, a valve of an exhaust line 6 is also opened. Thereafter, the valves of the third supply line 3 and the exhaust line 6 are closed and further the valve of the vacuum line 7 is opened so as to degas the reactor 4 into a vacuum until the inside of the reactor 4 turns into a predetermined pressure (for example, 10 Pa).

Next, the valve of the vacuum line 7 is closed and the valve of the third supply line 3 is opened to introduce the inert gas into the reactor so as to turn into the atmospheric pressure. When the inside of the reactor 4 turns into the atmospheric pressure, the valve of the exhaust line 6 is opened and then the fluorine resin film 5 subjected to the hydrophilicity-imparting treatment is taken out.

The fluorine resin film taken out from the reactor 4, which has been subjected to the hydrophilicity-imparting treatment, may be washed with a washing liquid such as water or an alcohol. This manner makes it possible to remove unreacted $F_2$, which is adsorbed on the fluorine resin film surface, or HF, which is generated by the reaction, so that a hydrophilic surface excellent in stability can be formed.

Figure 2:
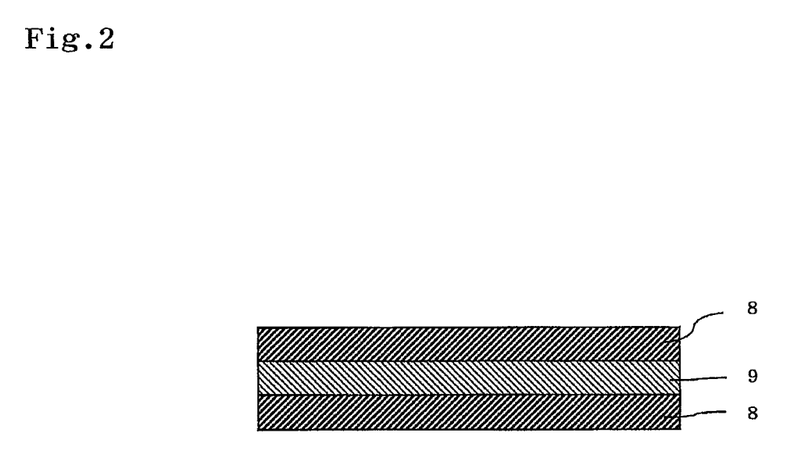
FIG. 2 The figure is a schematic sectional view which schematically illustrates a back sheet, for a solar battery, that has the fluorine resin film.

The fluorine resin film yielded by a hydrophilicity-imparting treatment as described above can be favorably applied to, for example, a back sheet for a solar battery. When the sheet is used as a back sheet for a solar battery, the film may be in a form as illustrated in FIG. 2. Specifically, fluorine resin films 8 according to the invention are bonded to both surfaces of a substrate film 9, respectively, through an adhesive. At this time, the fluorine resin films 8 of the invention have undergone the hydrophilicity-imparting treatment, as described above; thus, the adhesion thereof to the adhesive is good so that the films can be prevented from being peeled on the basis of being deteriorated with the passage of time. The thus-produced laminated film has a gas barrier performance against water vapor, oxygen gas and some other gas. Thus, a back sheet for a solar battery that is excellent in reliability can be produced.

The adhesive is not particularly limited, and may be, for example, a urethane adhesive or an epoxy adhesive. A pressure-sensitive adhesive (sticky agent) may be used. The pressure-sensitive adhesive is not particularly limited, and may be, for example, an acrylic, rubbery or urethane sticky agent.

EXAMPLES

Hereinafter, preferred examples of this invention will be illustratively described in detail. However, materials, blend amounts and so on that will be described in the examples are not intended to limit the scope of this invention into only the described materials and so on as far as no restrictive description thereabout is included. Thus, the materials and so on are mere descriptive examples.

Example 1

As illustrated in FIG. 1, a PVDF film (trade name: NAFLON, manufactured by Nichias Corp.; thickness: 2 mm) was first introduced, as a fluorine resin film 5, into the reactor 4. Next, the valve of the vacuum line 7 was opened to reduce the pressure in the reactor 4 down to 10 Pa or less.

Next, the valve of the vacuum line 7 was closed, and then the valve of the first supply line 1, for the supply of fluorine-atom-containing gas, and that of the second supply line 2, for the supply of oxygen-atom-containing gas, were simultaneously opened to introduce a process gas into the reactor 4 until the pressure thereof turned to the atmospheric pressure, the process gas being adjusted as follows: the ratio (by volume) of fluorine gas/oxygen gas/nitrogen gas therein was 5/95/0, and the total flow rate being 1.0 L/min. Furthermore, the valves of the first supply line 1 and the second supply line 2 were simultaneously closed to make the inside of the reactor into an airtight state. The reactor was then kept as it was for 5 minutes. The temperature of the inside of the reactor 4 was kept at 30° C. After a lapse of a predetermined period, the valves of the third supply line 3, for the supply of inert gas, and the exhaust line 6 were opened to substitute nitrogen gas, at a flow rate of 10 L/min, for the mixed gas of fluorine gas, oxygen gas and nitrogen gas in the reactor 4. Thereafter, the valves of the third supply line 3 and the exhaust line 6 were closed and the valve of the vacuum line 7 was opened to reduce the pressure in the reactor into 10 Pa or less.

Next, the valve of the vacuum line 7 was closed and the valve of the third supply line 3 was opened to introduce nitrogen gas at a flow rate of 1.0 L/min into the reactor 4 until the pressure thereof turned to the atmospheric pressure. After the inside of the reactor 4 turned to the atmospheric pressure, the valve of the exhaust line 6 was opened to take out the PVDF film subjected to the hydrophilicity-imparting treatment.

The taken-out PVDF film was washed with UPW (ultra pure water) of room temperature, which was being stirred, for 1 hour. After the washing, UPW on the surfaces was blown by effect of nitrogen gas, and then the film was dried at room temperature under a reduced pressure until the pressure turned to 10 Pa or less. A device, Drop Master 300, manufactured by Kyowa Interface Science Co., Ltd. was used to measure the contact angle (θ) of the dried PVDF film. The used measuring liquid was a surface energy measuring agent (surface tension γ: 25 to 70 mN/m) manufactured by Arcotest Co. Values of the cos θ (Y axis) versus γ (X axis) were plotted, and the extrapolative value of γLV giving 1 as a value of the solid/liquid contact angle cos θ was calculated, whereby the values were obtained. The results are shown in Table 1 described below.

Example 2

In the present example, the same hydrophilicity-imparting treatment as in Example 1 was conducted except that a PVF film (trade name: TEDLAR, manufactured by DuPont) was used as the fluorine resin film. Thereafter, values of the critical surface tension were calculated out.

Example 3

In the present example, the same hydrophilicity-imparting treatment as in Example 1 was conducted except that a PFA film (trade name: NAFLON, manufactured by Nichias Corp.) was used as the fluorine resin film. Thereafter, values of the critical surface tension were calculated out.

Example 4

In the present example, the same hydrophilicity-imparting treatment as in Example 1 was conducted except that a PCTFE film (trade name: YODOFLON, manufactured by Yodogawa Hu-Tech Co., Ltd.) was used as the fluorine resin film. Thereafter, values of the critical surface tension were calculated out.

Example 4

In the present example, the same hydrophilicity-imparting treatment as in Example 1 was conducted except that an ETFE film (trade name: YODOFLON, manufactured by Yodogawa Hu-Tech Co., Ltd.) was used as the fluorine resin film. Thereafter, values of the critical surface tension were calculated out.

Example 6

In the present example, the same hydrophilicity-imparting treatment as in Example 1 was conducted except that the process gas was changed to a gas wherein the ratio (by volume) of fluorine gas/sulfur dioxide gas/nitrogen gas was 5/95/0. Thereafter, values of the critical surface tension were calculated out.

Example 7

In the present example, the same hydrophilicity-imparting treatment as in Example 1 was conducted except that the process gas was changed to a gas wherein the ratio (by volume) of fluorine gas/carbonyl fluoride gas/nitrogen gas was 5/95/0. Thereafter, values of the critical surface tension were calculated out.

Example 8

In the present example, the same hydrophilicity-imparting treatment as in Example 1 was conducted except that the process gas was changed to a gas wherein the ratio (by volume) of fluorine gas/nitrogen gas was 0.001/99.999. Thereafter, values of the critical surface tension were calculated out. The supply of the process gas into the reactor 4 was performed by closing the valve of the vacuum line 7, opening the valves of the first supply line 1, for the supply of fluorine-atom-containing gas, and the third supply line 3, for the supply of nitrogen gas, simultaneously, and further closing the second supply line 2, for the supply of oxygen-atom-containing gas.

Example 9

In the present example, the same hydrophilicity-imparting treatment as in Example 8 was conducted except that a PVF film (trade name: TEDLAR, manufactured by DuPont) was used as the fluorine resin film. Thereafter, values of the critical surface tension were calculated out.

Example 10

In the present example, the same hydrophilicity-imparting treatment as in Example 1 was conducted except that the treating period was set to 0.5 minute and the temperature of the inside of the reactor 4 was changed to 100° C. Thereafter, values of the critical surface tension were calculated out.

Example 11

In the present example, the same hydrophilicity-imparting treatment as in Example 10 was conducted except that a PVF film (trade name: TEDLAR, manufactured by DuPont) was used as the fluorine resin film. Thereafter, values of the critical surface tension were calculated out.

Example 12

In the present example, the same hydrophilicity-imparting treatment as in Example 1 was conducted except that the process gas was changed to a gas wherein the ratio (by volume) of fluorine gas/oxygen gas/nitrogen gas was 0.5/20/79.5, the treating period was set to 1 minute and the temperature of the inside of the reactor 4 was changed to 50° C. Thereafter, values of the critical surface tension were calculated out. The supply of the process gas into the reactor 4 was performed by closing the valve of the vacuum line 7, and opening the valves of the first supply line 1, for the supply of fluorine-atom-containing gas, the second supply line 2, for the supply of oxygen gas, and the third supply line 3, for the supply of nitrogen gas, simultaneously.

Example 13

In the present example, the same hydrophilicity-imparting treatment as in Example 12 was conducted except that a PVF film (trade name: TEDLAR, manufactured by DuPont) was used as the fluorine resin film. Thereafter, values of the critical surface tension were calculated out.

Example 14

In the present example, the same hydrophilicity-imparting treatment as in Example 2 was conducted except that a PVF film to which PMMA was added in an amount of 30% by weight of the whole of the film was used as the fluorine resin film. Thereafter, values of the critical surface tension were calculated out.

Example 15

In the present example, a PVDF film to which PMMA (polymethyl methacrylate) was added in an amount of 30% by weight of the whole of the film was used as the fluorine resin film. The treating period was set to 5 minutes, and the temperature of the inside of the reactor 4 was changed to 30° C. Except the changes, the same hydrophilicity-imparting treatment as in Example 12 was conducted. Thereafter, values of the critical surface tension were calculated out.

Example 16

In the present example, the same hydrophilicity-imparting treatment as in Example 15 was conducted except that a PVDF film to which PMMA was added in an amount of 90% by weight of the whole of the film was used as the fluorine resin film. Thereafter, values of the critical surface tension were calculated out.

TABLE 1

| | | | Treating conditions | | | | Critical surface tension (mN/m) | | |
|---|---|---|---|---|---|---|---|---|---|
| | Species | Additive | Gas species | Concentration (% by volume) | Temperature (° C.) | Period (min) | Before the treatment | After the treatment | After one month |
| Example 1 | PVDF | None | $F_2/O_2/N_2$ | 5/95/0 | 30 | 5 | 25 | 31 | Not changed |
| Example 2 | PVF | None | $F_2/O_2/N_2$ | 5/95/0 | | | 29 | 38 | Not changed |
| Example 3 | PFA | None | $F_2/O_2/N_2$ | 5/95/0 | | | 18.5 | 20 | Not changed |
| Example 4 | PCTFE | None | $F_2/O_2/N_2$ | 5/95/0 | | | 31 | 35 | Not changed |
| Example 5 | ETFE | None | $F_2/O_2/N_2$ | 5/95/0 | | | 22 | 30 | Not changed |
| Example 6 | PVDF | None | $F_2/SO_2/N_2$ | 5/95/0 | | | 25 | 32 | Not changed |
| Example 7 | PVDF | None | $F_2/COF_2/N_2$ | 5/95/0 | | | 25 | 31 | Not changed |
| Example 8 | PVDF | None | $F_2/O_2/N_2$ | 0.001/0/99.999 | | | 25 | 30 | Not changed |
| Example 9 | PVF | None | $F_2/O_2/N_2$ | 0.001/0/99.999 | | | 29 | 31 | Not changed |
| Example 10 | PVDF | None | $F_2/O_2/N_2$ | 5/95/0 | 100 | 0.5 | 25 | 34 | Not changed |
| Example 11 | PVF | None | $F_2/O_2/N_2$ | 5/95/0 | | | 29 | 40 | Not changed |
| Example 12 | PVDF | None | $F_2/O_2/N_2$ | 0.5/20/79.5 | 50 | 1 | 25 | 31 | Not changed |
| Example 13 | PVF | None | $F_2/O_2/N_2$ | 0.5/20/79.5 | | | 29 | 38 | Not changed |
| Example 14 | PVF | PMMA 30 wt % | $F_2/O_2/N_2$ | 5/95/0 | 30 | 5 | 27 | 40 | Not changed |
| Example 15 | PVDF | PMMA 30 wt % | $F_2/O_2/N_2$ | 0.5/20/79.5 | | | 27 | 36 | Not changed |
| Example 16 | PVDF | PMMA 930 wt % | $F_2/O_2/N_2$ | 0.5/20/79.5 | | | 27 | 40 | Not changed |

REFERENCE NUMERALS

1 first supply line
2 second supply line
3 third supply line
4 reactor
5 fluorine resin film
6 exhaust line
7 vacuum line
8 fluorine resin film
9 substrate film

The invention claimed is:

1. A method for producing a backsheet for a solar battery comprising,
preliminarily preparing a process gas in a non-plasma state by mixing a gas consisting of fluorine atoms at a concentration of 0.001 to 99% by volume and an inert gas consisting of nitrogen, argon, helium, neon, krypton, or xenon in the absence of a fluorine resin film; and
imparting hydrophilicity to a surface of the fluorine resin film only by carrying out a reaction resulting from a treatment consisting of contacting the process gas in the non-plasma state with the fluorine resin film for a period of 1 second to 5 minutes, said fluorine resin film consisting essentially of a fluorine resin film other than ethylene/tetrafluoroethylene copolymer (ETFE), thereby producing a hydrophilized fluorine resin film,
washing the hydrophilized fluorine resin film subjected to the hydrophilicity-imparting treatment with a washing liquid in air under atmospheric pressure thereby removing an unreacted gas consisting of fluorine atoms, which is adsorbed on the surface of the hydrophilized fluorine resin film, and HF, which is generated by contacting the process gas with the fluorine resin, and
drying the hydrophilized fluorine resin film subjected to the washing, and thereafter bonding the dried hydrophilized fluorine resin film to both surfaces of a substrate film through an adhesive, thereby producing the back sheet for a solar battery,
wherein the fluorine resin film has a specific gravity greater than 1.6 and 2.2 or less,
thereby giving hydrophilicity to the surface of the fluorine resin film that has a critical surface tension of 18 mN/m or more, wherein the surface of the hydrophilized fluorine resin film has a critical surface tension that is greater than the critical surface tension of the fluorine resin film and that is 30 mN/m or more, and
wherein the fluorine resin film comprises 0.1 to 90% by weight of an organic additive having a functional group reactive with the process gas,
wherein the functional group is selected from the group consisting of amide, amino, trialkylsilyl, silyl ether, —Si(CH$_3$)$_2$O—, ester, carbonate, ether, phosphorylcholine, sulfo, sulfonyl, methyl, methylene, phenyl, —CHX—, —CHX$_2$, —CX$_2$, and —CX$_3$, wherein X is at least one of F, Cl, Br, or I.

2. The method for producing a backsheet for a solar battery according to claim 1, wherein the fluorine resin film comprises tetrafluoroethylene/perfluoroalkyl vinyl ether copolymer (PFA), polyvinylidene fluoride (PVDF), polyvinyl fluoride (PVF), polychlorotrifluoroethylene (PCTFE), or ethylene/chlorotrifluoroethylene copolymer (ETCFE).

3. The method for producing a backsheet for a solar battery according to claim 1, wherein the fluorine resin film is polyvinylidene fluoride (PVDF) or polyvinyl fluoride (PVF), and the organic additive is polymethyl methacrylate (PMMA).

* * * * *